US012748130B2

(12) United States Patent
Narita

(10) Patent No.: US 12,748,130 B2
(45) Date of Patent: Sep. 29, 2026

(54) ELECTRICAL CONNECTING DEVICE AND METHOD FOR MANUFACTURING ELECTRICAL CONNECTING DEVICE

(71) Applicant: Kabushiki Kaisha Nihon Micronics, Tokyo (JP)

(72) Inventor: Satoshi Narita, Aomori (JP)

(73) Assignee: Kabushiki Kaisha Nihon Micronics, Musashino (JP)

( * ) Notice: Subject to any disclaimer, the term of this patent is extended or adjusted under 35 U.S.C. 154(b) by 226 days.

(21) Appl. No.: 18/249,003

(22) PCT Filed: Dec. 3, 2021

(86) PCT No.: PCT/JP2021/044453
§ 371 (c)(1),
(2) Date: Apr. 13, 2023

(87) PCT Pub. No.: WO2022/153712
PCT Pub. Date: Jul. 21, 2022

(65) Prior Publication Data

US 2023/0400481 A1 Dec. 14, 2023

(30) Foreign Application Priority Data

Jan. 14, 2021 (JP) ................................ 2021-004004

(51) Int. Cl.
*G01R 1/073* (2006.01)

(52) U.S. Cl.
CPC ................................ *G01R 1/07342* (2013.01)

(58) Field of Classification Search
CPC ........................... G01R 1/073; G01R 1/07342; G01R 1/07314; G01R 1/0735; G01R 1/07371; G01R 3/00; G01R 1/0416; G01R 1/06; G01R 1/067; G01R 1/06711; G01R 1/0675; G01R 31/2808; H01L 22/00
See application file for complete search history.

(56) References Cited

U.S. PATENT DOCUMENTS

| | | | | |
|---|---|---|---|---|
| 2019/0113539 | A1 | 4/2019 | Crippa et al. | |
| 2020/0269315 | A1 * | 8/2020 | Dobashi | B22F 1/06 |

(Continued)

FOREIGN PATENT DOCUMENTS

| | | | |
|---|---|---|---|
| JP | H095390 | A | 1/1997 |
| JP | 2007056206 | A | 3/2007 |
| JP | 2010281583 | A | 12/2010 |

(Continued)

OTHER PUBLICATIONS

JP_2018036136, Mar. 8, 2018.*

*Primary Examiner* — Son T Le
(74) *Attorney, Agent, or Firm* — Ingrassia Fisher & Lorenz, LLP

(57) ABSTRACT

An electrical connecting device includes a first guide plate having first guide holes through which probes are inserted, a second guide plate having second guide holes through which the probes are inserted, and an introduction film arranged between the first guide plate and the second guide plate and having introduction guide holes through which the probes are inserted. The introduction film is formed from material that is dissolved by a specific solvent that does not dissolve the first guide plate, the second guide plate, and the probes.

20 Claims, 9 Drawing Sheets

(56) References Cited

U.S. PATENT DOCUMENTS

| | | | | |
|---|---|---|---|---|
| 2021/0307160 | A1* | 9/2021 | Ahn | ......................... G01R 3/00 |
| 2022/0221502 | A1 | 7/2022 | Sato | |

FOREIGN PATENT DOCUMENTS

| | | | | |
|---|---|---|---|---|
| JP | 2018004260 | A | | 1/2018 |
| JP | 2018036136 | A | * | 3/2018 |
| JP | 2019523396 | A | | 8/2019 |
| JP | 2020183902 | A | | 11/2020 |

* cited by examiner

ELECTRICAL CONNECTING DEVICE AND METHOD FOR MANUFACTURING ELECTRICAL CONNECTING DEVICE

TECHNICAL FIELD

The present invention relates to an electrical connecting device and a method of manufacturing the electrical connecting device used for measuring properties of a measurement target.

BACKGROUND ART

An electrical connecting device including probes is used so as to measure a measurement target such as an integrated circuit in a state of not being split from a wafer. The measurement by use of the electrical connecting device is executed such that one ends of the respective probes are brought into contact with signal terminals of the measurement target, while the other ends of the respective probes are brought into contact with electrode terminals (also referred to below as "lands") provided on a printed substrate, for example. The lands are electrically connected to a measuring device such as an IC tester. Electrical signals are transferred between the measurement target and the measuring device via the electrical connecting device.

The electrical connecting device includes a probe head in which a plurality of guide plates are arranged in an axial direction of the probes so as to hold the probes. The probe head holds the probes in a state in which the probes are inserted into penetration holes (referred to below as "guide holes") provided in the respective guide plates.

CITATION LIST

Patent Literature

Patent Literature 1: Japanese Unexamined Patent Application Publication No. 2010-281583

SUMMARY OF THE INVENTION

Technical Problem

In the manufacture of the electrical connecting device including the guide plates, the probes are continuously inserted to the guide holes of the plural guide plates separately overlapping with each other. The conventional method has a problem with the process of inserting the probes into the guide holes of all of the guide plates. The probes inserted into the guide holes of the first guide plate frequently hit the second and following guide plates because of deformation of the probes, for example.

In response to this issue, the present invention provides an electrical connecting device and a method of manufacturing the electrical connecting device that can facilitate the insertion of probes into guide holes provided in guide plates.

Solution to Problem

An aspect of the present invention provides an electrical connecting device includes a first guide plate having a first guide hole through which the probe is inserted, a second guide plate having a second guide hole through which the probe is inserted, and an introduction film arranged between the first guide plate and the second guide plate and having an introduction guide hole through which the probe is inserted. The introduction film is formed from a material that is dissolved by a specific solvent that does not dissolve the first guide plate, the second guide plate, and the probe.

Advantageous Effects of the Invention

The present invention can provide the electrical connecting device and the method of manufacturing the electrical connecting device that can facilitate the insertion of the probes into the guide holes provided in the guide plates.

DESCRIPTION OF EMBODIMENTS

Figure 1:
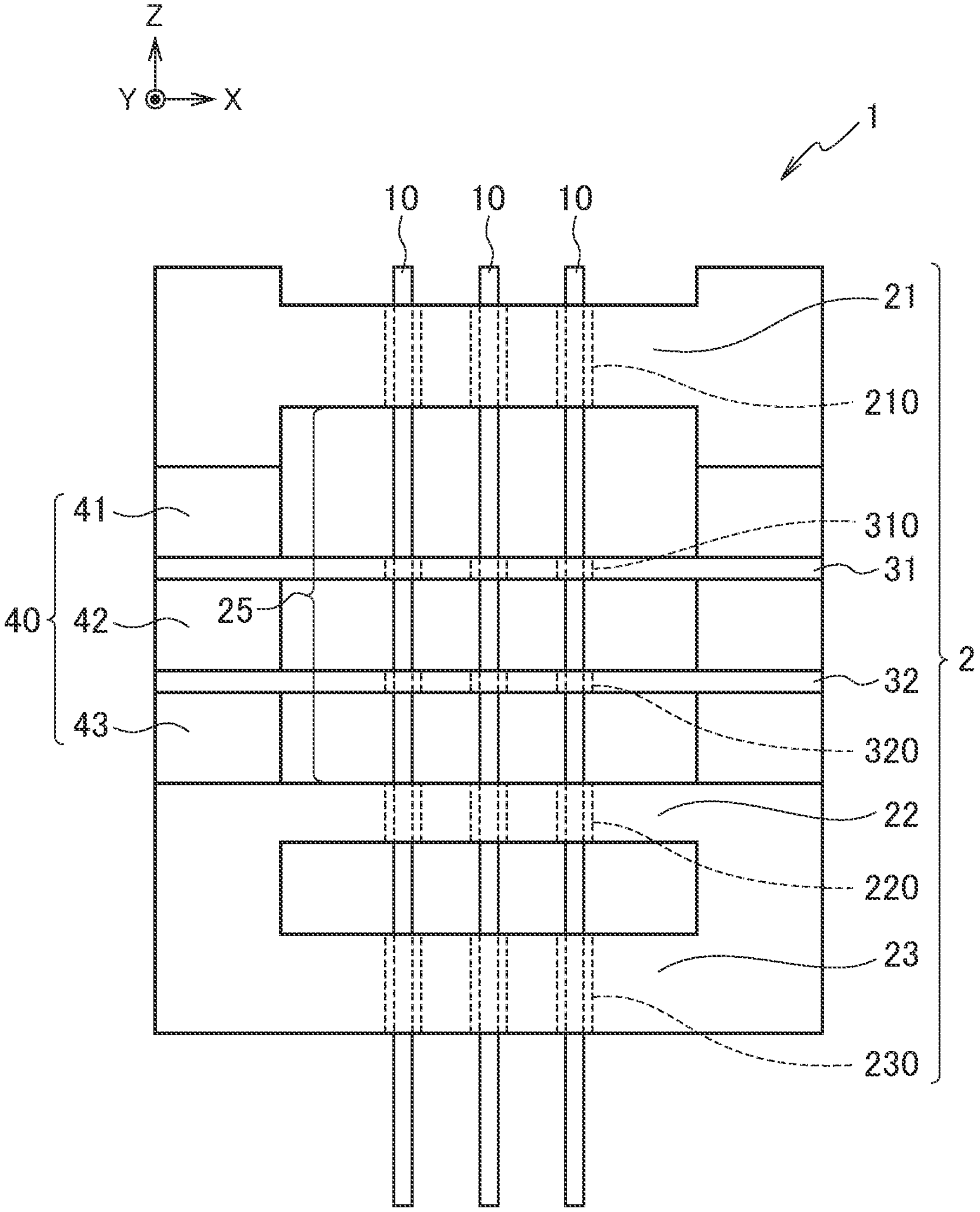
FIG. 1 is a schematic diagram illustrating a structure of an electrical connecting device according to an embodiment of the present invention.

Some embodiments of the present invention are described below with reference to the drawings. The same or similar elements illustrated in the drawings are denoted below by the same or similar reference numerals. It should be understood that the drawings are shown as schematic illustrations, and the proportions of the thicknesses of the respective elements in the drawings are not drawn to scale. It should also be understood that the dimensional relationships or proportions between the respective drawings can differ from each other. The embodiments according to the present invention described below illustrate devices and methods for embodying the technical idea of the present invention, but are not intended to be limited to the materials, shapes, structures, or arrangements of the constituent elements as described herein.

FIG. 1 illustrates a structure of an electrical connecting device 1 according to an embodiment. The electrical connecting device 1 includes a probe head 20 having a configuration that holds probes 10. The probe head 2 includes a first guide plate 21, a second guide plate 22, and a third guide plate 23. The probe head 2 has a structure in which the second guide plate 22 and the third guide plate 23 are integrated together. The probe head 2 further includes a first introduction film 31 and a second introduction film 32 arranged separately from each other between the first guide plate 21 and the second guide plate 22.

As illustrated in FIG. 1, the probe head 2 has a structure in which the first guide plate 21, the first introduction film 31, the second introduction film 32, the second guide plate 22, and the third guide plate 23 are sequentially arranged in this order in the Z-axis direction. The Z-axis direction as described herein corresponds to an axial direction of the probes 10 held by the probe head 2. A planar surface perpendicular to the Z-axis direction is defined as an X-Y plane.

The first guide plate 21, the second guide plate 22, the third guide plate 23, the first introduction film 31, and the second introduction film 32 are each provided with guide holes through which the probes 10 are inserted. The guide holes of the first guide plate 21 are referred to below as first guide holes 210, the guide holes of the second guide plate 22 are referred to below as second guide holes 220, and the guide holes of the third guide plate 23 are referred to below as third guide holes 230. The guide holes of the first introduction film 31 are referred to below as first introduction guide holes 310, and the guide holes of the second introduction film 32 are referred to below as second introduction guide holes 320.

The guide plates included in the probe head 2 such as the first guide plate 21 to the third guide plate 23 are also collectively referred to below as "guide plates 20". The guide holes provided in the respective guide plates 20 are also referred to below as "guide holes 200". The introduction films included in the probe head 2 such as the first introduction film 31 and the second introduction film 32 are also collectively referred to below as "introduction films 30". The guide holes provided in the respective introduction films 30 are also referred to below as "introduction guide holes 300".

The probe head 2 holds the probes 10 such that the probes 10 extend in a straight state, as illustrated in FIG. 1. In other words, the guide plates 20 and the introduction films 30 are arranged such that the respective central axes of the guide holes 200 of the guide plates and the introduction guide holes 300 of the introduction films 30 conform to each other.

The probe head 2 includes a spacer 40 arranged between an outer circumferential region of the first guide plate 21 and an outer circumferential region of the second guide plate 22. A hollow region 25 is defined by the spacer 40 between the first guide plate 21 and the second guide plate 22. The first introduction film 31 and the second introduction film 32 are provided in the hollow region 25. As described below, the probe head 2 holds the respective probes 10 in a curved state in the hollow region 25 upon the measurement of the measurement target.

The spacer 40 illustrated in FIG. 1 has a structure in which a plurality of partial spacers overlap with each other in the Z-axis direction. In particular, the spacer 40 includes three partial spacers of a first spacer 41, a second spacer 42, and a third spacer 43 that overlap with each other between the first guide plate 21 and the second guide plate 22 in the Z-axis direction. The outer circumferential parts of the respective introduction films 30 are interposed between the respective partial spacers. The outer circumferential part of the first introduction film 31 is interposed between the first spacer 41 and the second spacer 42. The outer circumferential part of the second introduction film 32 is interposed between the second spacer 42 and the third spacer 43.

FIG. 1 illustrates the case in which the probe head 2 holds the three probes 10 for illustration purposes and brevity. The number of the probes 10 held by the probe head 2 is determined as appropriate depending on the number of the signal terminals provided in the measurement target.

The respective introduction films 30 are formed from material dissolved by a specific solvent that does not dissolve the constituents in the probe head 2 excluding the introduction films 30 and the probes 10. In other words, the first introduction film 31 and the second introduction film 32 are dissolved by a specific solvent that does not dissolve the guide plates 20 and the spacers 40 in the probe head 2, and the probes 10.

For example, the material used for the introduction films 30 may be any of polyvinyl alcohol, starch, and gelatin. A ceramic material, for example, is used for the constituents in the probe head 2 excluding the introduction films 30, namely, for the guide plates 20 and the spacers 40. The probes 10 are formed from material such as palladium (Pd) and nickel (Ni). In this case, water may be used as the specific solvent that dissolves the introduction films 30 without dissolving the guide plates 20, the spacer 40, and the probes 10.

A method of manufacturing the electrical connecting device 1 according to the embodiment is described below with reference to FIG. 2 to FIG. 5. The respective drawings used for explaining the method below show only one probe 10 while omitting the illustration of the spacer 40 for brevity. The actual manufacturing method uses a necessary number of the probes 10 determined depending on the measurement of the measurement target.

Figure 2:
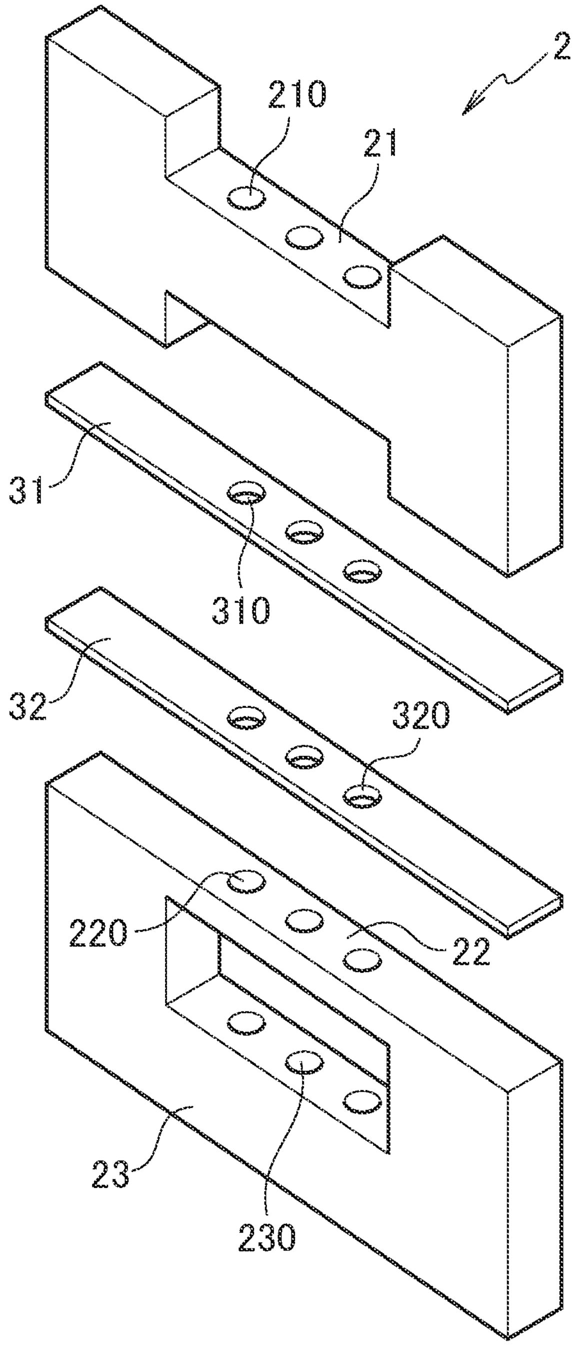
FIG. 2 is a schematic process view for explaining a method of manufacturing the electrical connecting device according to the embodiment of the present invention (part 1).
Figure 3:
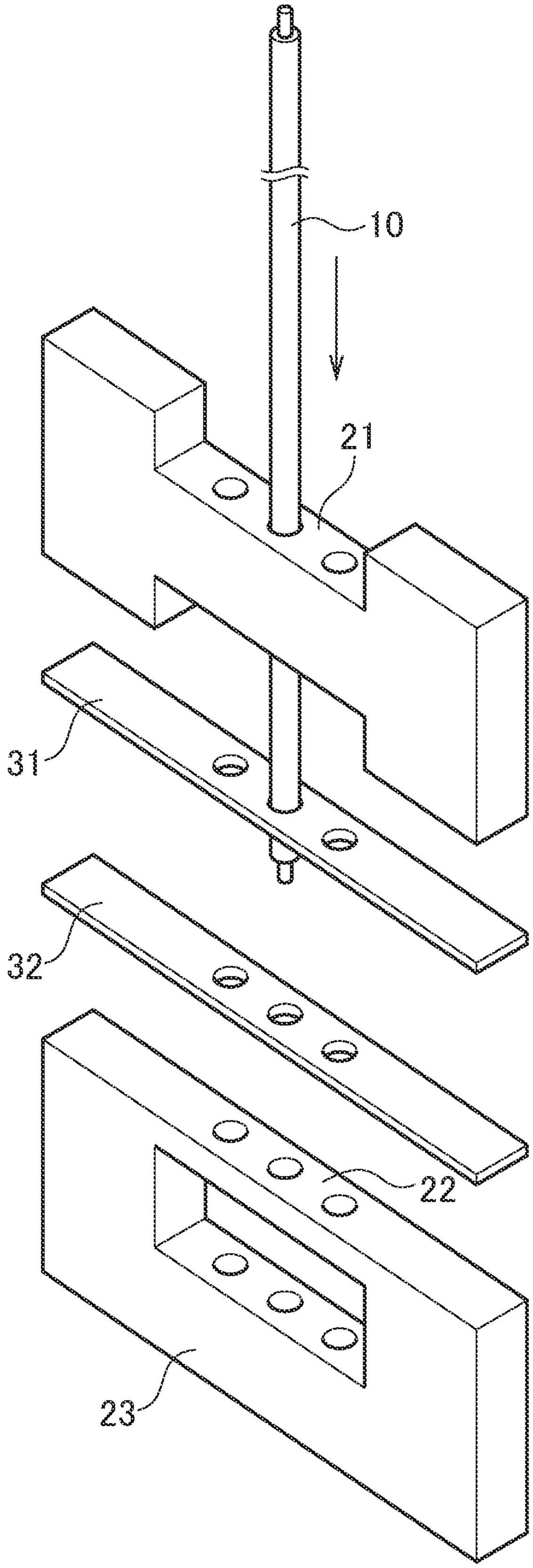
FIG. 3 is a schematic process view for explaining the method of manufacturing the electrical connecting device according to the embodiment of the present invention (part 2).

First, the probe head 2 is prepared that includes the guide plates 20 provided with the guide holes 200 and the introduction films 30 provided with the introduction guide holes 300. In particular, the probe head 2 is prepared that includes the first guide plate 21 to the third guide plate 23, and the first introduction film 31 and the second introduction film 32, as illustrated in FIG. 2.

The probes 10 are then caused to be inserted to the guide holes 200 of the respective guide plates 20 and the introduction guide holes 300 of the respective introduction films 30 in the probe head 2. For example, as indicated by the arrow in FIG. 3, the probes 10 are continuously inserted into the first guide holes 210, the first introduction guide holes 310, the second introduction guide holes 320, the second guide holes 220, and the third guide holes 230 in this order. The probes 10 are caused to be inserted into the respective guide holes 200 and the respective introduction guide holes 300 in the state in which the respective central axes of the guide holes 200 and the introduction guide holes 300 conform to each other.

Figure 4:
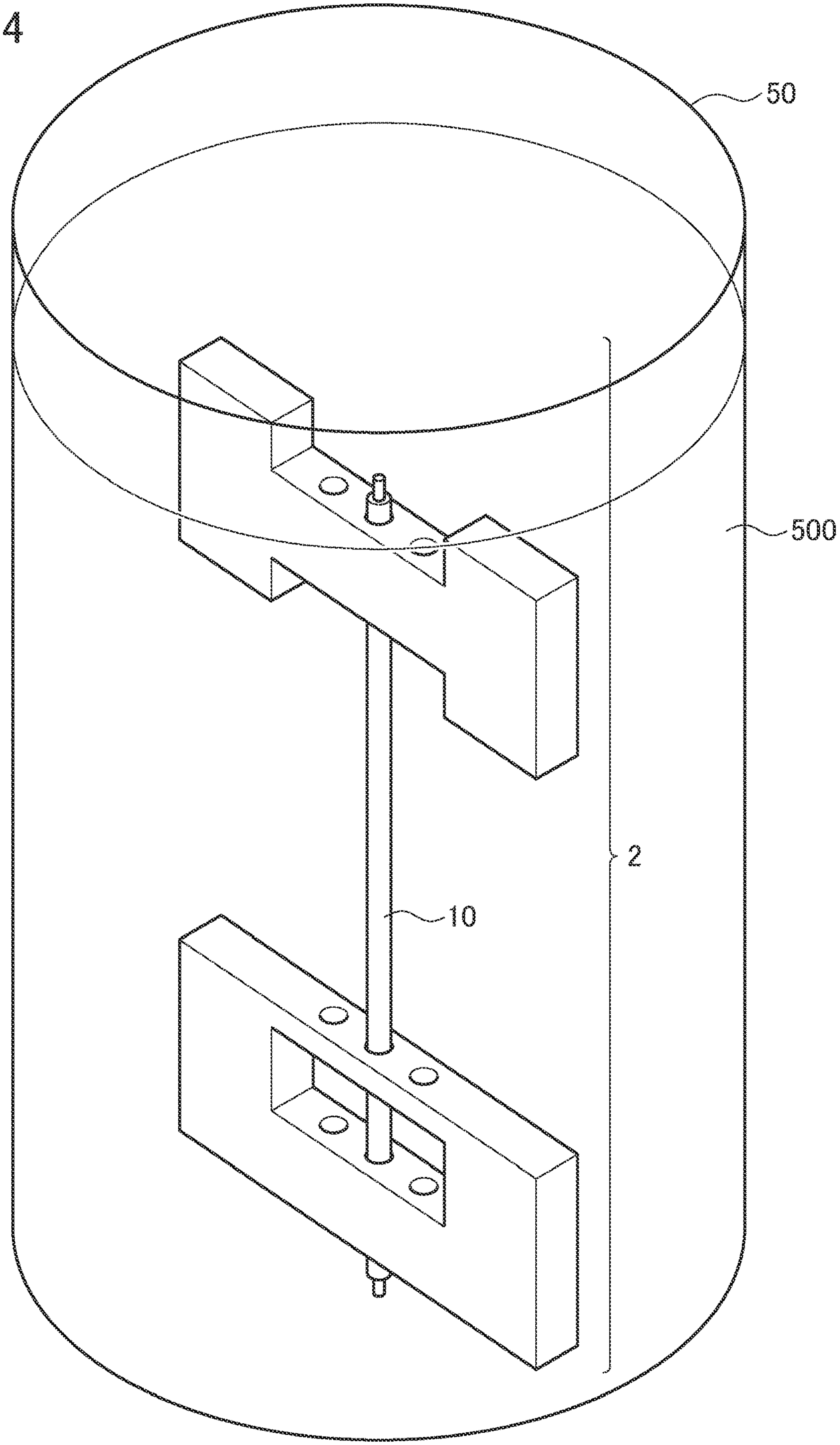
FIG. 4 is a schematic process view for explaining the method of manufacturing the electrical connecting device according to the embodiment of the present invention (part 3).
Figure 5:
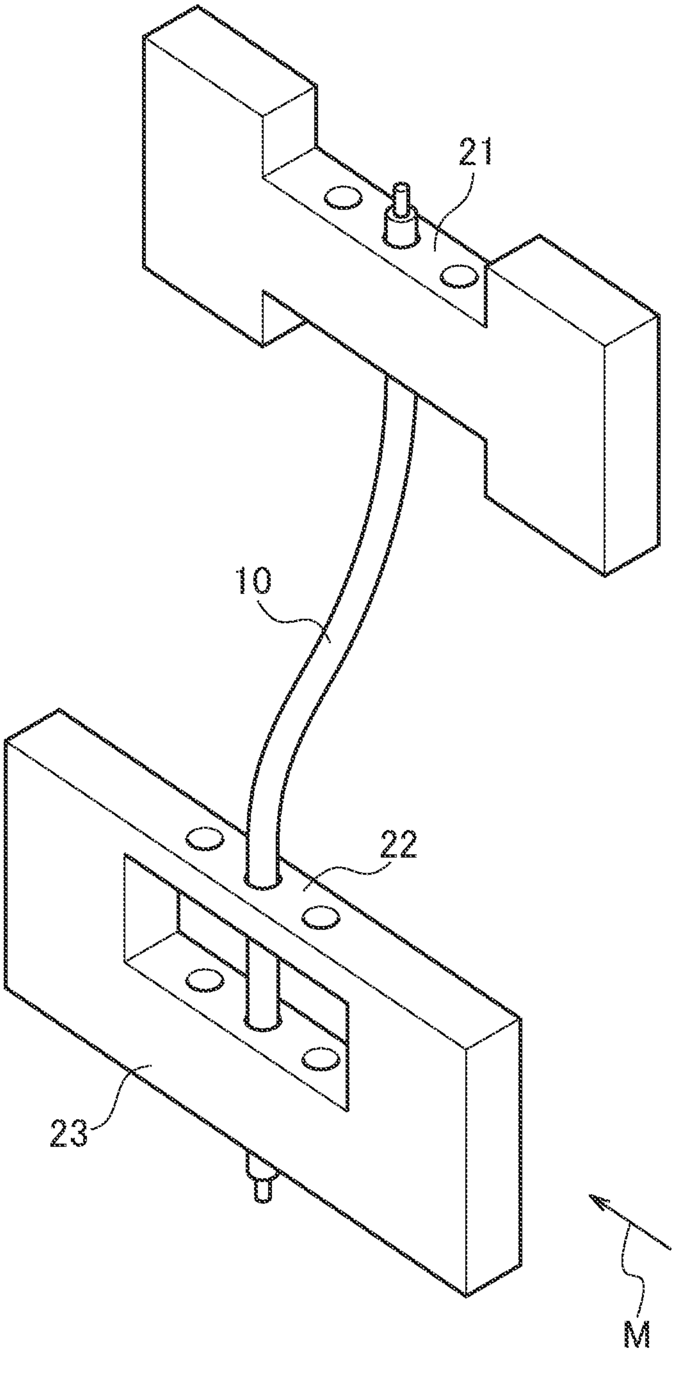
FIG. 5 is a schematic process view for explaining the method of manufacturing the electrical connecting device according to the embodiment of the present invention (part 4).

Next, the introduction films 30 are dissolved by the specific solvent that does not dissolve each of the guide plates 20, the spacer 40, and the probes 10. For example, as illustrated in FIG. 4, a container 50 is prepared that stores a solvent 500 for dissolving the introduction films 30 without dissolving the constituents in the probe head 20 other than the introduction films 30 or dissolving the probes 10. The probe head 2 holding the probes 10 is immersed in the solvent 500. The immersion of the probe head 2 in the solvent 500 dissolves the introduction films 30.

When the introduction films 30 are dissolved, gaps corresponding to the thicknesses of the respective introduction films 30 are provided between the partial spacers. These gaps can be closed up such that the first guide plate 21 and the second guide plate 22 are pressed against each other in the Z-axis direction. The probe head 2 may have a structure in which the first guide plate 21 to the third guide plate 23 are joined to each other with screws penetrating the spacer 40 and the respective introduction films 30, for example. Fastening the screws closes up the gaps caused between the respective partial spacers composing the spacer 40.

After the introduction films 30 are dissolved, the relative positions of the second guide holes 220 with respect to the first guide holes 210 are caused to be shifted in the direction perpendicular to the extending direction of the probes 10. The relative positions between the second guide holes 220 and the third guide holes 230 in this case do not need to be changed. For example, as indicated by the arrow M in FIG. 5, the second guide plate 22 and the third guide plate 23 are moved parallel to the first guide plate 21.

The partial parallel movement of the guide plates 20 shifts the positions of the guide holes 200 through which the same probes 10 are inserted in the direction parallel to the main surface of the respective guide plates 20 as viewed in the surface normal direction of the main surface of the guide plates 20. Namely, the second guide holes 220 and the third guide holes 230 are shifted in parallel with respect to the first guide plate 210. The arrangement in which the positions of the respective guide holes 200 are shifted is referred to below as an "offset positioning".

The offset positioning leads the probes 10 to be curved by the elastic deformation in the hollow region 25 between the first guide plate 21 and the second guide plate 22. The probe head 2 is thus configured to allow the relative positions of the second guide holes 220 with respect to the first guide holes 210 to be shifted in the direction perpendicular to the extending direction of the probes 10 so as to achieve the offset positioning.

Figure 6:
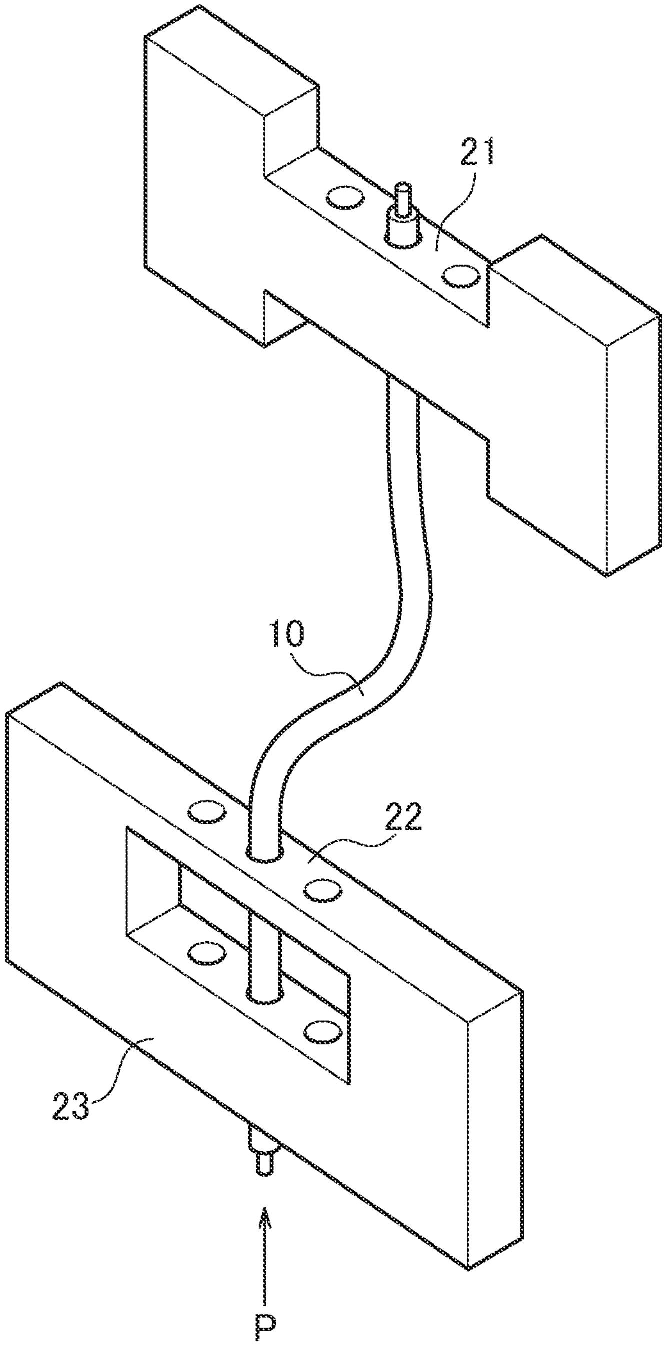
FIG. 6 is a schematic view for explaining an offset positioning.

When the tip ends of the probes 10 held by the probe head 2 are brought into contact with the measurement target, a stress P in the axial direction of the probes 10 is applied to the probes 10, as indicated by the arrow in FIG. 6. The probes 10 then buckle in the hollow region 25 in the probe head 2 in the state of the offset positioning. Namely, the probes 10 are further greatly curved due to the bending deformation between the first guide plate 21 and the second guide plate 22. This can bring the probes 10 into contact with the measurement target at a stable pressure.

Figure 7:
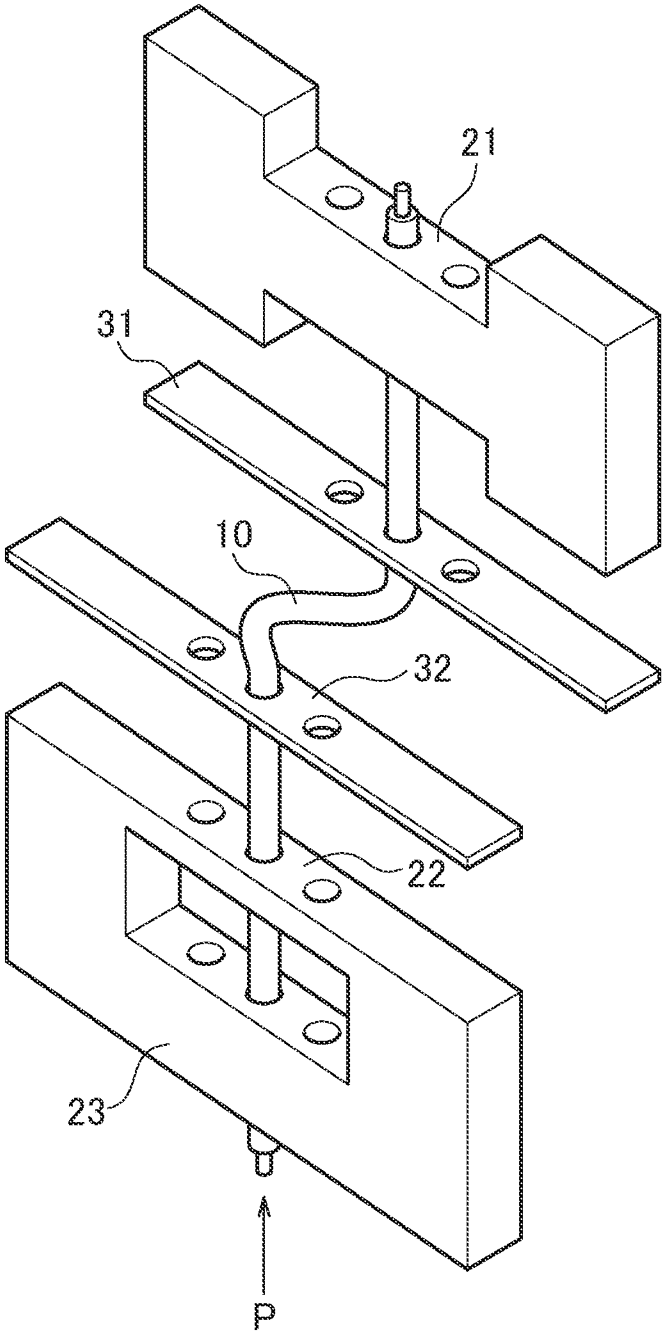
FIG. 7 is a schematic view illustrating an electrical connecting device of a comparative example.

In a comparative example in which the introduction films 30 are not removed from the probe head 2, the space in which the probes 10 buckle is narrow. This cannot lead the probes 10 to which the stress P is applied to buckle into a predetermined shape, as illustrated in FIG. 7, for example. The probes 10 thus cannot be stably brought into contact with the measurement target at a predetermined pressure. In addition, if the introduction films 30 are left in the probe head 2, the probes 10 are greatly curved between the respective introduction films 30. This may prevent the probes 10 from returning to the original straight shape and keep the deformed state even after the release of the stress P. If the deformed state of the probes 10 is kept, the probes 10 are not brought into contact with the measurement target at a predetermined pressure, which impedes the accurate measurement. Further, if the probes 10 are curved in this state, it is difficult to draw the probes 10 out of the probe head 2 when the probes 10 need to be replaced from the probe head 2. In addition, if the probes 10 located in the probe head 2 are curved, the probe 10 newly inserted to the probe head 2 comes into contact with the other curved probes 10, which impedes the smooth replacement of the probes 10.

Figure 8:
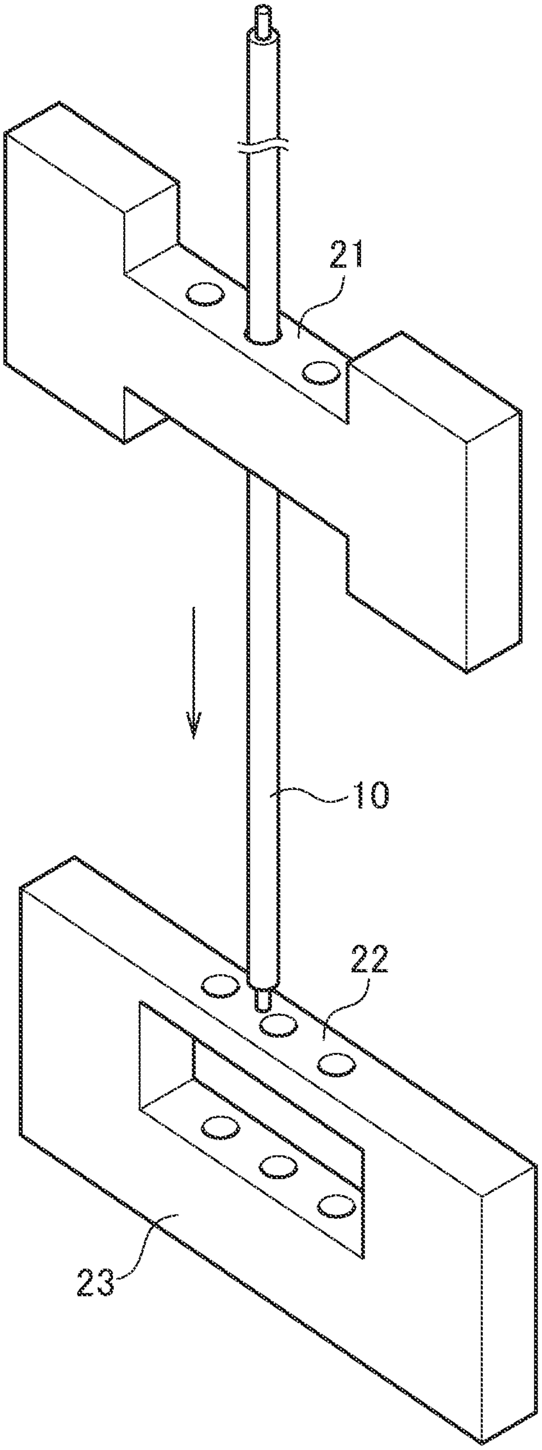
FIG. 8 is a schematic view for explaining a method of manufacturing the electrical connecting device of the comparative example.

If the introduction films 30 are not provided in the probe head, on the other hand, the gap between the respective guide holes 200 through which the same probe 10 is inserted is wide. This case frequently impedes the continuous insertion of the probes 10 into the guide holes 200 of all of the guide plates 20 because of bending of the probes 10 or a problem with a positional accuracy of the guide holes 200 derived from an error during the manufacture. For example, as illustrated in FIG. 8, which shows a method of manufacturing the electrical connecting device of the comparative example, the tip of the probe 10 inserted to the guide hole of the first guide plate 21 hits the surface of the second guide plate 22. The probe head not provided with the introduction films 30 thus has a problem that the probes 10 cannot penetrate all of the guide plates.

For example, when the respective probes 10 have the entire length of 3 mm and the outer diameter of 60 μm, the inner diameter of the guide holes 200 is set to about 65 μm, and the gap between the guide hole 200 and the guide hole 200 is about 15 μm. In this case, if the probes 10 are bent even slightly, the tips of the probes 10 can hit the guide plates 20 during the process of inserting the probes 10 into the probe head. Increasing the inner diameter of the guide holes 200 to deal with this can reduce the probability that the probes 10 hit the guide plates 20. However, the increase in the inner diameter of the guide holes 20 causes a deviation of the positions of the probes 10 inside the guide holes 20. This leads to a decrease in accuracy of the positioning between the probes 10 and the measurement target.

In contrast, the electrical connecting device 1 enables the probes 10 to be inserted to the guide holes 200 of the guide plates 20 while correcting the positions of the probes 10 by the introduction guide holes 300 of the introduction films 30. The electrical connecting device 1 thus can enable the probes 10 to penetrate through the guide holes 200 of all of the guide plates 20 without the necessity of increasing the difference between the outer diameter of the probes 10 and the inner diameter of the guide holes 200.

As described above, the electrical connecting device 1 according to the embodiment uses the introduction films 30 to be arranged in the hollow region 25 in which the gap between the respective guide plates 20 is wide. This can decrease the gaps in the axial direction between the respective guide holes through which the probes 10 are inserted. The electrical connecting device 1 thus facilitates the insertion of the probes 10 into the guide holes 200 provided in the respective guide plates 20.

While FIG. 1 illustrates the case in which the probe head 2 includes the first guide plate 21 to the third guide plate 33, the number of the guide plates included in the probe head 2 is not limited to three. For example, the probe head 2 may include two guide plates of the first guide plate 21 and the second guide plate 22. Alternatively, the probe head 2 may include four or more guide plates.

While the present embodiment is illustrated above with the case in which the probe head 2 includes the first introduction film 31 and the second introduction film 32, the number of the introduction films 30 in the probe head 2 is not limited to two. For example, the number of the introduction films 30 in the probe head 2 may be three or greater. While the present embodiment is illustrated above with the case in which the plural introduction films 30 are arranged separately from each other between the first guide plate 21 and the second guide plate 22, the probe head 2 may include the single introduction film 30.

For example, when the distance of the hollow region 25 in the Z-axis direction is long, the number of the introduction films 30 is increased. This can facilitate the correction of the positions of the probes 10 in the entire hollow region 25. When the distance of the hollow region 25 in the Z-axis direction is short, the number of the introduction films 30 can be decreased. The decrease in the number of the introduction films 30 can reduce the manufacturing cost of the electric connecting device 1. When the respective probes 10 have the entire length of 3 mm and the outer diameter of 60 μm, the gaps between the guide plates 20 and the introduction films 30 may be set to about 1 mm, for example.

While the present embodiment is illustrated above with the case in which all of the introduction films 30 are removed from the probe head 2, the present embodiment can be applied to a manufacturing method in which not all of the introduction films 30 are removed from the probe head 2. For example, the plural introduction films 30 may be partly removed from the probe head 2 so as to ensure a space in which the probes 10 can buckle into a predetermined shape in the hollow region 25. In such a case, the introduction film 30 to be removed may only be immerged in the specific solvent. Alternatively, the introduction film to be dissolved may be formed from the material that can be dissolved by the specific solvent, while the other introduction films 30 to be left in the probe head 2 may be formed from material that is not dissolved by the specific solvent.

Figure 9:
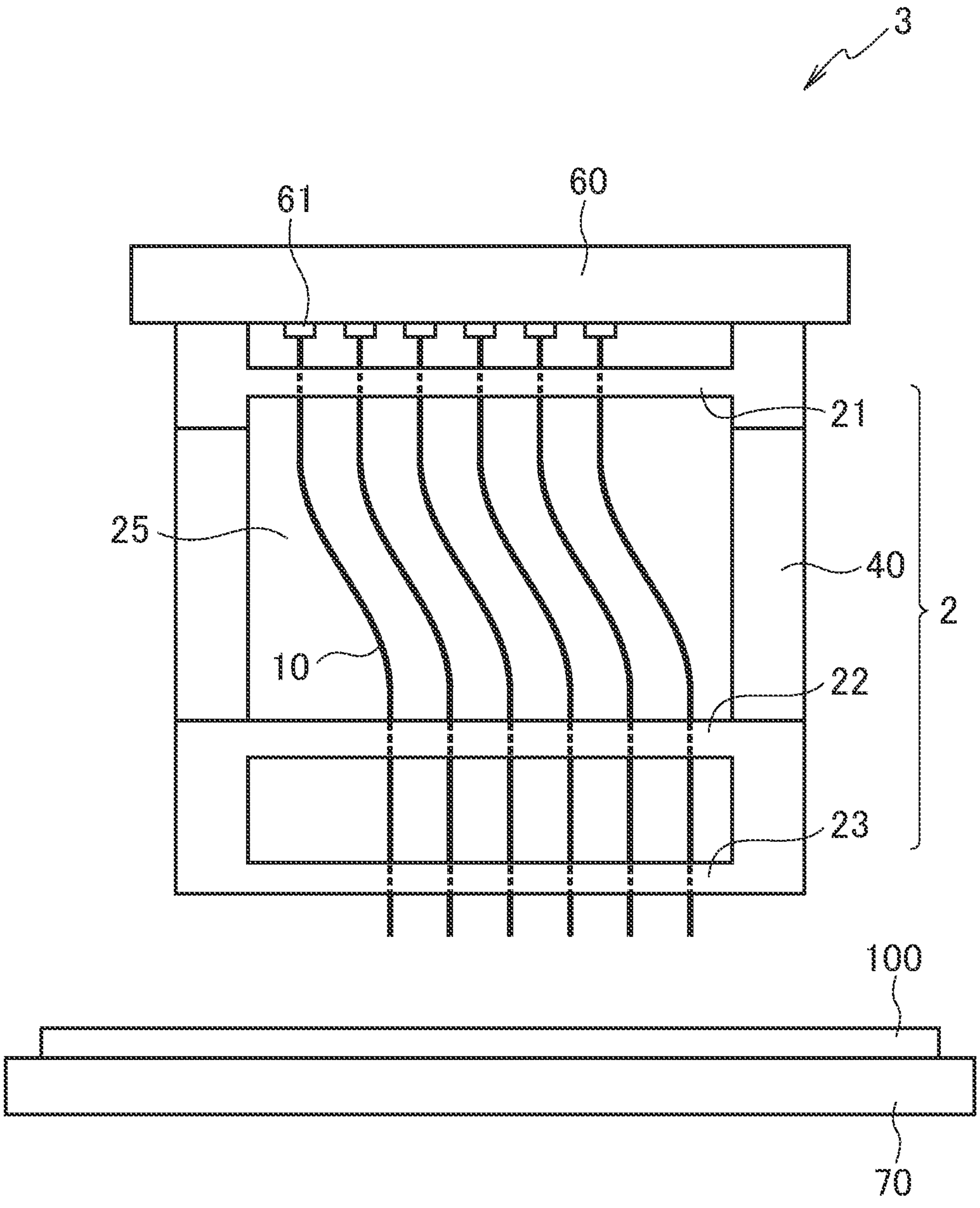
FIG. 9 is a schematic view showing an example of a probe card using the electrical connecting device according to the embodiment of the present invention.

FIG. 9 illustrates a configuration example of a probe card 3 including the electrical connecting device 1 manufactured by the manufacturing method as described above. The probe card 3 is used for the measurement of the electrical properties of the measurement target 100. The probe card 3 illustrated in FIG. 9 is a vertical operation-type probe card, in which a stage 70 on which the measurement target 100 is mounted is raised up so that the tip ends of the probes 10 are brought into contact with the measurement target 100, for example. FIG. 9 illustrates a state in which the probes 10 are not brought into contact with the measurement target 100 yet.

The probe card 3 includes the probe head 2 holding the probes 10 and a wired substrate 60. The probes 10 are bent in the hollow region 25 defined by the spacer 40 between the first guide plate 21 and the second guide plate 22. The distal ends of the probes exposed on the upper surface of the first guide plate 21 of the probe head 2 are connected to electrode terminals (lands 61) arranged on the lower surface of the wired substrate 60 opposed to the probe head 2. The respective lands 61 are electrically connected to the measurement device (not illustrated) such as an IC tester.

Upon the measurement of the measurement target 100, the tip ends of the probes exposed on the lower surface of the third guide plate 23 of the probe head 2 are brought into contact with pads for measurement (not illustrated) provided on the measurement target 100. The electrical signals are transferred between the measurement target 100 and the measuring device via the probes 10 and the wired substrate 60. For example, a predetermined voltage or current is applied to the measurement target 100 from the measuring device via the probes 10. The electrical signals output from the measurement target 100 are transmitted to the measuring device via the probes 10, so as to measure the properties of the measurement target 100. After the measurement of the electrical properties of the measurement target 100, the stage 70 on which the measurement target 100 is mounted comes down so as to lead the probes 10 and the measurement target 100 to be in a non-contact state.

OTHER EMBODIMENTS

While the present invention has been described above with reference to the embodiment, it should be understood that the descriptions and the drawings composing part of this disclosure are not intended to limit the present invention. Various alternative embodiments, examples, and technical applications will be apparent to those skilled in the art according to this disclosure.

While the embodiment is illustrated above with the case in which the outer circumferential parts of the introduction films 30 are interposed by the partial spacers, the introduction films 30 may be arranged in the hollow region 25 by any other means. For example, the end parts of the introduction films 30 may be joined to the wall surface of the spacer 40 facing the hollow region 25.

While the embodiment is illustrated above with the case in which the cross-sectional shape of the probes 10 and the respective shapes of the guide holes 200 and the introduction guide holes 300 are circular, these components do not need to have the circular shape. For example, the cross-sectional shape of the probes 10 and the respective shapes of the guide holes 200 and the introduction guide holes 300 may be rectangular instead.

It should be understood that the present invention includes various embodiments not disclosed herein.

What is claimed is:

1. An electrical connecting device comprising:
a first guide plate having a first guide hole;
a second guide plate having a second guide hole; and
an introduction film arranged only between the first guide plate and the second guide plate, and having an introduction guide hole; and
a probe continuously extending through the first guide hole, the introduction guide hole, and the second guide hole;
wherein the introduction film is configured to correct a position of the probe by the introduction guide hole;
wherein the introduction film is formed from a material configured to be dissolved by a specific solvent that does not dissolve the first guide plate, the second guide plate, and the probe, and
wherein the introduction film is formed from a material that is any of polyvinyl alcohol, starch, and gelatin.

2. The electrical connecting device according to claim 1, wherein the first guide plate, the second guide plate, and the introduction film are arranged such that central axes of the first guide hole, the second guide hole, and the introduction guide hole conform to each other.

3. The electrical connecting device according to claim 1, wherein a relative position of the second guide hole with respect to the first guide hole is allowed to be shifted in a direction perpendicular to an extending direction of the probe.

4. The electrical connecting device according to claim 1, further comprising a spacer not dissolved by the specific solvent, the spacer being arranged between an outer circumferential part of the first guide plate and an outer circumferential part of the second guide plate, wherein the introduction film is arranged in a hollow region defined by the spacer between the first guide plate and the second guide plate.

5. The electrical connecting device according to claim 4, wherein an outer circumferential part of the introduction film is interposed between partial spacers composing the spacer.

6. The electrical connecting device according to claim 1, wherein the electrical connecting device comprises a plurality of the introduction films arranged separately from each other only between the first guide plate and the second guide plate, wherein each introduction film is formed from a material configured to be dissolved by the specific solvent.

7. The electrical connecting device according to claim 1, wherein:

the introduction film has a first introduction guide hole and a second introduction guide hole;

the probe is a first probe;

the electrical connecting device further comprises a second probe; and a respective probe extends through each introduction guide hole.

8. The electrical connecting device according to claim 7, wherein:

the first guide plate has two first guide holes;

the second guide plate has two second guide holes; and a respective probe extends through each first guide hole, introduction guide hole, and second guide hole.

9. The electrical connecting device according to claim 1, wherein:

the probe is a first probe;

the electrical connecting device further comprises a second probe;

the first guide plate has two first guide holes and includes a first middle portion located between the two first guide holes;

the second guide plate has two second guide holes and includes a second middle portion located between the two second guide holes;

a portion of the introduction film is located directly between the first middle portion and the second middle portion; and a respective probe extends through each first guide hole, introduction guide hole, and second guide hole.

10. The electrical connecting device according to claim 1, wherein:

the first guide plate has two first guide holes and includes a first middle portion located between the two first guide holes;

the second guide plate has two second guide holes and includes a second middle portion located between the two second guide holes; and a portion of the introduction film is located directly between the first middle portion and the second middle portion.

11. The electrical connecting device according to claim 1, wherein:

the introduction film has a first surface and an opposite second surface;

the introduction guide hole extends from the first surface to the second surface;

the first surface is uncovered adjacent to the introduction guide hole; and the second surface is uncovered the introduction guide hole.

12. The electrical connecting device according to claim 1, wherein:

a hollow region is defined between the first guide plate and the second guide plate; and the introduction film spans across the hollow region.

13. The electrical connecting device according to claim 1, wherein:

a hollow region is defined between the first guide plate and the second guide plate; and the introduction film spans across the hollow region to divide a first portion of the hollow region from a second portion of the hollow region; and the introduction guide hole interconnects the first portion of the hollow region and the second portion of the hollow region.

14. The electrical connecting device according to claim 1, wherein:

the probe comprises a plurality of probes;

the first guide plate has a plurality of first guide holes;

the second guide plate has a plurality of second guide holes; and the introduction film has a plurality of introduction guide holes;

wherein each probe in the plurality of probes extends through a respective first guide hole, a respective introduction guide hole, and a respective second guide hole.

15. The electrical connecting device according to claim 14, wherein each introduction guide hole receives a single probe from the plurality of probes.

16. A method of manufacturing an electrical connecting device, comprising:

preparing a probe head including a first guide plate having a first guide hole, a second guide plate having a second guide hole, and an introduction film having an introduction guide hole and arranged between the first guide plate and the second guide plate;

continuously inserting a probe through the first guide hole, the introduction guide hole, and the second guide hole; and after continuously inserting the probe through the first guide hole, the introduction guide hole, and the second guide hole, dissolving the introduction film by a specific solvent that does not dissolve the first guide plate, the second guide plate, and the probe.

17. The method of manufacturing the electrical connecting device according to claim 16, wherein the probe is inserted through the first guide hole, the introduction guide hole, and the second guide hole in a state in which central axes of the first guide hole, the second guide hole, and the introduction guide hole conform to each other.

18. The method of manufacturing the electrical connecting device according to claim 16, further comprising shifting a relative position of the second guide hole with respect to the first guide hole in a direction perpendicular to an extending direction of the probe after dissolving the introduction film.

19. The method of manufacturing the electrical connecting device according to claim 16, wherein the probe head comprises a plurality of the introduction films arranged separately from each other between the first guide plate and the second guide plate.

20. The method of manufacturing the electrical connecting device according to claim 16, wherein the introduction film is formed from a material that is any of polyvinyl alcohol, starch, and gelatin.

* * * * *